United States Patent
Rossi

(10) Patent No.: US 6,620,994 B2
(45) Date of Patent: Sep. 16, 2003

(54) THERMOELECTRIC GENERATORS

(75) Inventor: Andrea Rossi, Bedford, NH (US)

(73) Assignee: Leonardo Technologies, Inc., Bedford, NH (US)

( * ) Notice: Subject to any disclaimer, the term of this patent is extended or adjusted under 35 U.S.C. 154(b) by 0 days.

(21) Appl. No.: 09/971,280

(22) Filed: Oct. 4, 2001

(65) Prior Publication Data

US 2002/0046762 A1 Apr. 25, 2002

Related U.S. Application Data

(63) Continuation of application No. 09/679,041, filed on Oct. 4, 2000, now abandoned
(60) Provisional application No. 60/312,617, filed on Aug. 15, 2001, and provisional application No. 60/158,530, filed on Oct. 8, 1999.

(51) Int. Cl.[7] .......................... H01L 35/34; H01L 35/16; H01L 35/20
(52) U.S. Cl. ...................... 136/201; 136/238; 136/239; 136/240; 136/241
(58) Field of Search .............................. 136/200, 201, 136/236.1, 238, 239, 240, 241

(56) References Cited

U.S. PATENT DOCUMENTS

| | | | |
|---|---|---|---|
| 3,095,330 A | 6/1963 | Epstein et al. | 136/5 |
| 3,136,134 A | 6/1964 | Smith | 62/3 |
| 3,182,391 A * | 5/1965 | Charland et al. | 419/48 |
| 3,248,777 A | 5/1966 | Stoll | 29/155.5 |
| 3,451,858 A | 6/1969 | Dingwall | 136/205 |
| 3,672,443 A | 6/1972 | Bienert et al. | 165/32 |
| 3,719,532 A | 3/1973 | Falkenberg et al. | 136/208 |
| 4,292,579 A | 9/1981 | Constant | 322/2 R |
| 4,463,214 A | 7/1984 | Lowther | 136/208 |
| 4,929,282 A * | 5/1990 | Brun et al. | 136/239 |
| 4,999,576 A | 3/1991 | Levinson | 324/142 |

(List continued on next page.)

FOREIGN PATENT DOCUMENTS

| | | |
|---|---|---|
| WO | WO 00/59047 | 10/2000 |
| WO | WO 01/69657 A2 | 9/2001 |

OTHER PUBLICATIONS

"Evaluate & Demostrate Broad Applications For Thermoelectric Devices for DOE's Office of Fossil Energy" DOE Contract No. DE–AM26–99FT40465, Product, Program and Project Engineering and Analysis (P3EA) Task 51304 submitted to: US Dept. of Energy, National Energy Technology Laboratory by: Concurrent Technologies Nov. 21, 2001.

"Evaluate & Demostrate Broad Applications for Thermoelectric Devices for DOE's Office of Industrial Technologies" DOE Contract No. DE–AM26–99FT40465, Product, Program and Project Engineering and Analysis (P3EA) Task 50517B submitted to: US Dept of Energy, National Energy Technology Laboratory by: Concurrent Technologies Corporation (CTC), Energy and Environmental Efficiency Management, Inc. (E3M, Inc.) and Leonardo Technologies, Inc. (LTI) Nov. 27, 2001.

Primary Examiner—Patrick Ryan
Assistant Examiner—Thomas H. Parsons
(74) Attorney, Agent, or Firm—Grossman, Tucker, Perreault & Pfleger, PLLC

(57) ABSTRACT

A thermoelectric module including a couple formed between two bismuth telluride thermoelectrodes. The first thermoelectrode is doped with palladium, selenium, or a combination of the two. The second thermoelectrode is doped with antimony, gold, or a combination of the two. Multiple thermoelectric modules may be used in series and parallel to achieve the desired voltage and current outputs.

17 Claims, 3 Drawing Sheets

U.S. PATENT DOCUMENTS

| | | | |
|---|---|---|---|
| 5,108,515 A | * 4/1992 | Ohta et al. | 136/201 |
| 5,246,504 A | * 9/1993 | Ohta et al. | 136/201 |
| 5,318,743 A | * 6/1994 | Tokiai et al. | 419/38 |
| 5,419,780 A | 5/1995 | Suski | 136/205 |
| 5,592,067 A | 1/1997 | Peter et al. | 320/15 |
| 5,763,293 A | 6/1998 | Yamashita et al. | 438/55 |
| 5,856,210 A | 1/1999 | Leavitt et al. | 438/55 |
| 5,921,087 A | 7/1999 | Bhatia et al. | 62/3.2 |
| 6,002,081 A | 12/1999 | Sakuragi | 136/203 |
| 6,103,967 A | 8/2000 | Cauchy et al. | 136/201 |
| 6,147,293 A | * 11/2000 | Tauchi et al. | 136/236.1 |
| 6,222,242 B1 | 4/2001 | Konishi et al. | 257/467 |
| 6,225,548 B1 | 5/2001 | Sakakibara et al. | 136/201 |
| 6,226,994 B1 | 5/2001 | Yamada et al. | 62/3.7 |
| 6,233,944 B1 | 5/2001 | Yamada et al. | 62/3.7 |
| 6,269,645 B1 | 8/2001 | Yamaguchi | 60/653 |
| 6,274,802 B1 | 8/2001 | Fukuda et al. | 136/201 |
| 6,274,803 B1 | 8/2001 | Yoshioka et al. | 136/201 |
| 6,288,321 B1 | 9/2001 | Fleurial et al. | 136/205 |

\* cited by examiner

THERMOELECTRIC GENERATORS

REFERENCE TO RELATED APPLICATIONS

The present application is a continuation in part of U.S. patent application Ser. No. 09/679,041, filed on Oct. 4, 2000, now abandoned, which claims the benefit of U.S. provisional application Ser. No. 60/158,530 filed Oct. 8, 1999, now abandoned, and claims priority to U.S. provisional application Ser. No. 60/312,617, filed Aug. 15, 2001. The teachings of both applications are incorporated herein by reference.

FIELD OF THE INVENTION

The present invention relates to the thermoelectric generation of electricity.

BACKGROUND OF THE INVENTION

There are three principle thermoelectric phenomena: the Seebeck effect, the Peltier effect, and the Thomson effect. Advantageous thermoelectric generation is based on the interacting relationships of these effects. The Seebeck effect is the production of an electrical potential occurring when two different conducting materials are joined to form a closed circuit with junctions at different temperatures. The Peltier effect relates to the absorption of heat occurring when an electric current passes through a junction of two different conductors. The third thermoelectric principle, the Thomson effect, is the reversible evolution of heat that occurs when an electric current passes through a homogeneous conductor having a temperature gradient about its length.

The Seebeck effect is the phenomenon directly related to thermoelectric generation. According to the Seebeck effect, thermoelectric generation occurs in a circuit containing at least two dissimilar materials having one junction at a first temperature and a second junction at a second different temperature. The dissimilar materials giving rise to thermoelectric generation in accordance with the Seebeck effect are generally n-type and p-type semiconductors.

While these thermoelectric principles have been known for more than a century, the extreme high cost of generating even a small amount of electricity has prevented any widespread use of these thermoelectric effects for power generation. In fact, previously the Seebeck effect has been employed almost exclusively for thermocouples. Thermocouples in accordance with the Seebeck effect allow temperature measurement based upon a current induced in couples of metals, such as PT-Rh or Fe-Constantan. However, these couples cannot be advantageously used to generate electricity.

SUMMARY OF THE INVENTION

A thermoelectric generator consistent with the invention includes a couple of bismuth telluride thermoelectrodes, wherein one thermoelectrode is doped with either palladium (Pd) or selenium (Se), and the other thermoelectrode of the couple is doped with either antimony (Sb) or gold. Accordingly, the thermoelectric generator consistent with the present invention achieves highly efficient thermoelectric conversion.

A method for producing thermoelectrodes consistent with the invention herein is provided wherein the individual constituent metals are first purified. Following purification the constituent metals of each thermoelectrode are combined in precise stoichiometric ratios to produce stock salts. Finally, the stock salts are subjected to a sliding electrical resistance whereby the stock salts experience directional fusion. The directional fusion process produces an oriented crystalline structure in the final salts.

BRIEF DESCRIPTION OF THE DRAWINGS

Exemplary embodiments of the invention are set forth in the following description as shown in the drawings, wherein.

DETAILED DESCRIPTION OF THE INVENTION

Figure 1:
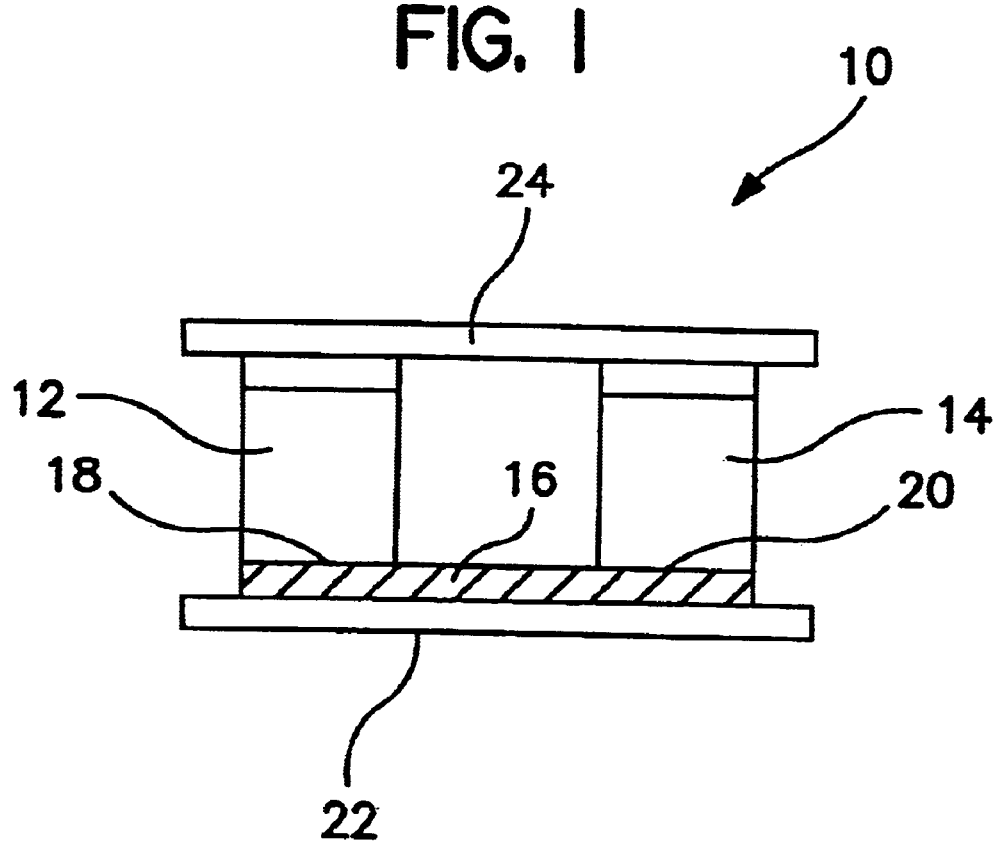
FIG. 1 schematically illustrates an exemplary thermoelectric module consistent with the present invention.

Referring to FIG. 1, the basic element of an exemplary thermoelectric pile consistent with the present invention is an individual thermoelectric module, shown at 10. The individual thermoelectric module 10 consistent with the present invention comprises a couple of thermoelectrodes 12 and 14, i.e., a junction formed between two semiconductor, termed thermoelectrodes. Each couple comprises a positive thermoelectrode 12 and a negative thermoelectrode 14, wherein the two thermoelectrodes are electrically coupled in a manner suitable to provide good continuity over the service temperature range of the element 10. In the exemplary embodiment illustrated in FIG. 1, the positive thermoelectrode 12 and the negative thermoelectrode 14 may be physically and electrically coupled via an aluminum connector, or strap, 16 soldered to the respective interfaces 18 and 20 of each of the two thermoelectrodes 12 and 14. An exemplary solder compound which may advantageously be employed comprises 60% tin-40% lead. Finally, the exemplary thermoelectric module 10 is completed by sandwiching the assembled positive and negative thermoelectrodes 12 and 14 between two thin sheets of alumina 22 and 24, thereby providing the thermoelectric module 10 in the form of a wafer or chip.

Consistent with the present invention, the positive thenoelectrode 12 and the negative thermoelectrode 14 may each comprise bismuth telluride. The relative thermoelectric polarity of each of the thermoelectrodes may be controlled by the incorporation of a dopant. According to the exemplary embodiment consistent with the present invention the positive thermoelectrode 12 may be formed by doping the bismuth telluride electrode with antimony (Sb) or gold (Au). The negative thermoelectrode 14 may be formed by doping bismuth telluride with palladium (Pd) or selenium (Se). Because bismuth telluride ejects electrons along the conductive orbitals when heated as the thermoelectric couple 10 is heated on one side, the electrons migrate from the positive thermoelectrode 12 to the negative thermoelectrode 14, therein producing a current.

Performance of the thermoelectric modules 10 consistent with the present invention may be optimized by employing the semiconductors, i.e., the thermoelectrodes 12 and 14, in the form of salts bound in regular and equal crystals. Reaching this configuration requires that the constituent ingredients first be refined to an extremely high state of purity. Subsequent to refining, the positive and negative salts must be formed. Finally, the crystals of the respective positive and negative salts must be oriented.

In order to obtain the optimum performance, it is preferable to obtain a 99.99% purity level in individual constituent metals. This level of purity requires a multi-step refinement process. In the refinement process a 99.5% purity in the constituent metals, bismuth, tellurium, antimony, and selenium, may be achieved. The metals may be placed in individual crucibles and fused in a vacuum environment. The fused metals may then be placed in individual quartz ampoules and a sliding electric resistance may be induced therethrough, thereby inducing a directional fusion. The walls of the quartz ampoules may be coated with activated carbon which will absorb impurities and act as a lubricant for the subsequent extraction of the purified bars. The directional fusion may be carried out at a speed of between about 5–25 mm per hour, thereby extracting the impurities and oxygen from the metals.

After the constituent metals have been purified, the salts may be produced by mixing and fusing the metals in exact stoichiometric ratios while under vacuum. To produce the exemplary positive salt bismuth, tellurium, and antimony may be combined in a crucible in a 2:3:3 stoichiometric ratio. Correspondingly, the negative salt may be formed by combining bismuth, tellurium and selenium in a crucible in a 2:3:3 stoichiometric ratio. The crucible may be agitated during the fusion process to provide adequate mixing of the metals.

After the metals have been mixed and fused, the crystals of the salts are aligned to allow the electrons freed during the thermoelectric generation to move with a minimum of resistance through the crystalline structure. The alignment of the crystals may be accomplished by directional fusion of each of the salts. As during refinement of the metals, each of the fused salts is transferred to a quartz ampoule containing activated carbon lined walls. The directional fusion of the salts may be carried out at a rate of 2–3 mm per hour. During experimentation, the power consumption for producing salts having oriented crystal structures is approximately 30 kW per kilogram of salt.

Following the orientation of the crystal structures of the salts, the salts are extracted from the quartz ampoules and sliced into wafers. The cutting of the salt bars may be carried out by employing laser cutting. During the cutting operation, respect should be given to the direction of the directional fusion, i.e., the orientation of the crystals. The positive and negative salt wafers are finally assembled, soldered, and sandwiched between alumina wafers as described previously. It should be appreciated that all of the above described refinement, orientation, and assembly operations may advantageously be automated, therein minimizing human error and involvement.

Experimental performance evaluations have been conducted on the exemplary embodiment discussed above. A thermoelectric module 10 having a positive thermoelectrode 12 and a negative thermoelectrode 14 each dimensioned 5 mm×5 mm×1 mm thick will perform as follows:

ratio watts/surface area=10 W/cm$^2$
ratio of weight/watts=1 g/W
ratio of weight/surface area=10 g/cm$^2$ Accordingly, a module 10 weighing 1 kg and having a surface area of 10 cm×10 cm can generate 1 kW of electric power.

Figure 2:
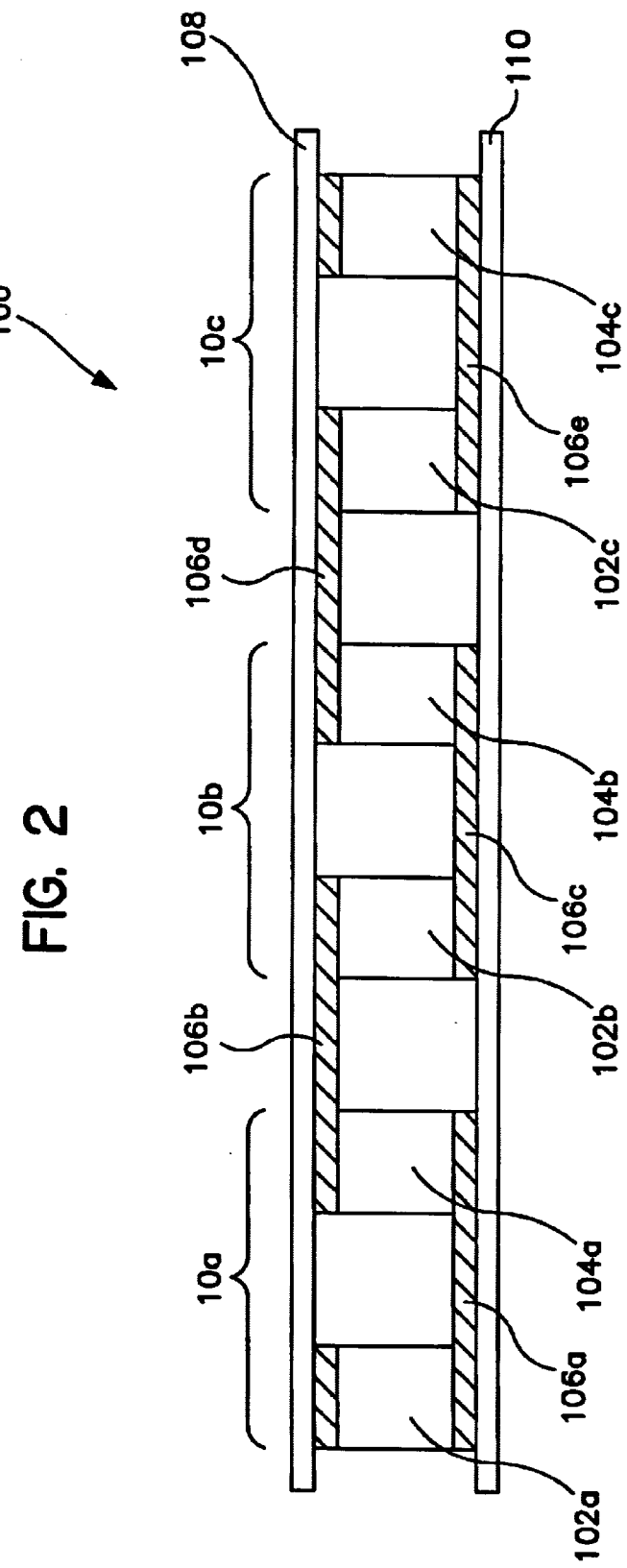
FIG. 2 schematically illustrates an exemplary thermoelectric cell consistent with the present invention, comprising a plurality of thermoelectric modules as shown in FIG. 1.

FIG. 2 schematically illustrates an exemplary thermoelectric generation cell 100, herein also referred to as a chip, consistent with the present invention. The chip 100 is shown comprising three individual thermoelectric modules 10a, 10b, 10c, corresponding to the thermoelectric module illustrated in FIG. 1, however the number of individual modules is widely variable. Accordingly, the chip comprises three positive thermoelectrodes 102a–c and three negative thermoelectrodes 104a–c. As illustrated, the positive thermoelectrodes 102a–c and the negative thermoelectrodes 104a–c are connected in electrical series by aluminum straps 106a–e. Finally, the chip 100 is completed by providing an two alumina wafers 108 and 110, one to either side of the thermoelectric generation cell 100.

Many alternate embodiments consistent with the present invention may be derived from the above described chip 100. The number of individual modules may be varied according to specific needs, and the positive thermoelectrodes 102 and the negative thermoelectrodes 104 may be configured in other than a planar and linear arrangement. It is only required that the modules be connected in electrical series and thermal parallel. Accordingly, while aluminum straps 106 are preferred, any conductive material will perform this function, including, but not limited to, copper, iron alloys, tin, gold, etc. Similarly, the alumina layers may be replaced by various material. It is preferred that the outer layers provide high thermal conductivity, but it is only necessary that they be electrically insulating. Accordingly, the alumina layers may be replaced with glass, mineral products, polymeric materials, etc. These and other variations will become more apparent from the following working examples consistent with the present invention.

Figure 3:
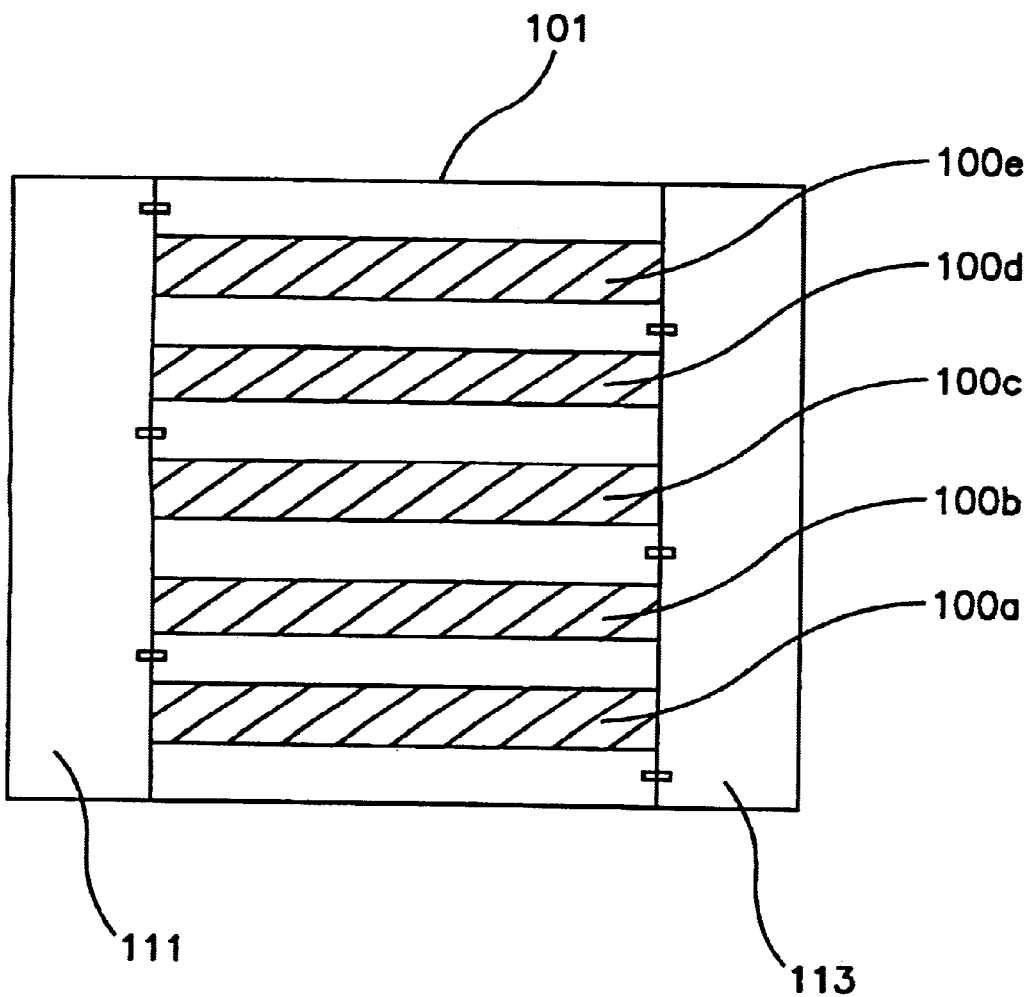
FIG. 3 illustrates a first exemplary apparatus employing the thermoelectric modules consistent with the present invention.

A first exemplary method for employing the thermoelectric generation cell is illustrated in FIG. 3. According to this application, a plurality of thermoelectric chips 100a–e are arranged spaced apart and in parallel to one another within a container 101, whereby the chips 100a–e act as partitions within the container 101. The spaces between the chips 100a–e are alternately in communication with either a heating medium supplied by manifold 111, or a cooling medium supplied from manifold 113. Exemplary heating mediums may include heated water, steam, or heated oil, while the cooling medium is preferably chilled water, air, or refrigerant. Accordingly, when the heating and cooling mediums are caused to flow through the spaces between the chips 100a–e, the requisite temperature gradient is established to drive the thermoelectric generation.

In the above described example, the heating medium may include the exhaust coolant from an industrial application or an internal combustion engine. Many industrial processes generate a great deal of heat that must be taken away be coolants. The coolants that become heated during the cooling cycle are then typically either exhausted into the environment, such as a water way, or are recycle and rechilled for further use. As an intervening step before exhaust or recycling the coolant may be run through an apparatus consistent with FIG. 3 whereby the extracted thermal energy may be put to the beneficial use of generating electricity.

The thermoelectric generator consistent with the present invention may similarly be utilized in any application where waste heat is generated. For example, a thermoelectric generator may be applied to the exhaust manifold of an engine, such as an automobile engine. The thermal energy for the thermoelectric generator is supplied by the hot exhaust gas, while a heat sink in the air stream of the moving vehicle may be employed on the "cold side" of the generator.

Similarly, the thermoelectric couples may be attached to the compressor of a refrigeration unit. The thermoelectric modules may be applied to a sheet of ZENITE, a liquid crystal polymer produced by DuPont, which is a good thermal conductor and electrical insulator. The cold side of the thermocouples may be cooled by providing them with a heat sink which is in the air stream of the refrigerator's cooling fan.

Thermoelectric generation may also be driven by a thermochemical reaction. An exemplary such reaction is based on the strong affinity of palladium for deuterium during the electrolysis reaction of deuterium oxide. The thermoelectric generator may be configured such that the positive pole of the thermoelectric generator is connected to a platinum anode and the negative pole of the thermoelectric generator is connected to a palladium cathode. The two electrodes are immersed in a bath of deuterium oxide contained within a glass heat exchanger. The heat exchanger is thermally coupled to the hot side of the thermoelectric generator. Once the reaction has been initiated using an external power source, sufficient heat will be evolved to sustain the reaction using the thermoelectric generator. The cold side of the thermoelectric generator may be cooled by means such as a heat sink and a fan or fluid forced convention, as by cooling water.

As a final exemplary application of the present invention, spent nuclear fuel rods may be used as the source of thermal energy, thereby fully utilizing the available energy in the fuel rod before it is discarded. The thermoelectric generators may be applied directly to the fuel rods using steel straps. Cooling of the "cold" side of the thermoelectric generator may be accomplished by providing the cold side with a heat sink and submerging the fuel rod in a cooling pool. Alternately, cooling may be accomplished by providing a circulating coolant in contact with the cold side of the thermoelectric generator.

The individual thermoelectric modules consistent with the present invention may be arranged electrically in series and/or in parallel to achieve the desired voltage and current output. Furthermore, any of the above embodiments consistent with the present invention may advantageously incorporate an inverter capable of providing an alternating current electrical output from the direct current produced by the thermoelectric generator. Additionally, it will be appreciated that batteries, or other electrical storage devices, may also be employed in conjunction with the invention herein.

It will be appreciated that the exemplary embodiment described and depicted in the accompanying drawings herein is for illustrative purposes only, and should not be interpreted as a limitation. It is obvious that many other embodiments, which will be readily apparent to those skilled in the art, may be made without departing materially from the spirit and scope of the invention as defined in the appended claims.

What is claimed is:

1. A method of producing a thermoelectrode comprising:
    forming a salt by combining purified bismuth and purified tellurium with at least one of selenium, palladium, antimony, and gold in a 2:3:3 stoichiometric ratio;
    directionally fusing the salt to produce an oriented crystalline structure in the salt.

2. The method according to claim 1 wherein the step of forming the salt comprises directionally fusing the bismuth, tellurium and at least one of selenium, palladium, antimony, and gold individually at a rate of between about 5–25 mm per hour.

3. The method according to claim 2 wherein the step of directionally fusing comprises applying a sliding resistance to the bismuth, tellurium and at least one of selenium, palladium, antimony, and gold.

4. The method according to claim 1 wherein the step of directionally fusing the salt to produce the oriented crystalline structure comprises directionally fusing the salt at a rate of between about 2–3 mm per hour.

5. The method according to claim 1 wherein the step of directionally fusing the salt comprises applying a sliding resistance to the salt.

6. A method of producing a thermoelectrode comprising:
    forming a salt by combining bismuth and tellurium with at least one of selenium, palladium, antimony, and gold; and
    producing an oriented crystalline structure in said salt;
    wherein said oriented crystalline structure is produced by directionally fusing said salt.

7. The method according to claim 6 wherein said salt is formed by directionally fusing said bismuth, tellurium and at least one of selenium, palladium, antimony, and gold individually at a rate of between about 5–25 mm per hour.

8. The method according to claim 7 wherein said directionally fusing said salt comprises applying a sliding resistance to said bismuth, tellurium and at least one of selenium, palladium, antimony, and gold.

9. The method according to claim 6 wherein said directionally fusing said salt comprises directionally fusing said salt at a rate of between about 2–3 mm per hour.

10. The method according to claim 6 wherein said directionally fusing said salt comprises applying a sliding resistance to said salt.

11. The method according to claim 6, wherein said bismuth and said tellurium are purified.

12. A method of producing a thermoelectrode comprising:
    forming a salt by combining bismuth and tellurium with at least one of selenium, palladium, antimony, and gold; and
    producing an oriented crystalline structure in said salt;
    wherein said bismuth and tellurium are combined with said at least one of selenium, palladium, antimony, and gold in a 2:3:3 stoichiometric ratio.

13. The method according to claim 12 wherein said salt is formed by directionally fusing said bismuth, tellurium and at least one of selenium, palladium, antimony, and gold individually at a rate of between about 5–25 mm per hour.

14. The method according to claim 13 wherein said directionally fusing said salt comprises applying a sliding resistance to said bismuth, tellurium and at least on of selenium, palladium, antimony, and gold.

15. The method according to claim 12 wherein said directionally fusing said salt comprises directionally fusing said salt at a rate of between about 2–3 mm per hour.

16. The method according to claim 12 wherein said directionally fusing said salt comprises applying a sliding resistance to said salt.

17. The method according to claim 12, wherein said bismuth and said tellurium are purified.

* * * * *